United States Patent
Bednorz et al.

(10) Patent No.: US 7,872,901 B2
(45) Date of Patent: Jan. 18, 2011

(54) PROGRAMMABLE-RESISTANCE MEMORY CELL

(75) Inventors: Johannes Georg Bednorz, Wolfhausen (CH); Siegfried F. Karg, Adliswil (CH); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 11/957,797

(22) Filed: Dec. 17, 2007

(65) Prior Publication Data

US 2008/0152932 A1    Jun. 26, 2008

(30) Foreign Application Priority Data

Dec. 19, 2006    (EP)    .................................. 06126497

(51) Int. Cl.
*G11C 11/00*    (2006.01)

(52) U.S. Cl. ........................ 365/148; 365/100; 365/104

(58) Field of Classification Search ................. 365/148, 365/100, 104
See application file for complete search history.

(56) References Cited

U.S. PATENT DOCUMENTS

| | | | |
|---|---|---|---|
| 4,839,700 A * | 6/1989 | Ramesham et al. | ......... 361/500 |
| 6,611,449 B1 | 8/2003 | Hilliger | |
| 6,620,207 B1 | 9/2003 | Lin | |
| 6,815,744 B1 * | 11/2004 | Beck et al. | ................... 257/295 |
| 7,583,534 B2 * | 9/2009 | Forbes et al. | ........... 365/185.18 |
| 2003/0217335 A1 | 11/2003 | Chung | |
| 2008/0142925 A1 * | 6/2008 | Bednorz et al. | ............. 257/536 |

* cited by examiner

*Primary Examiner*—Pho M Luu
(74) *Attorney, Agent, or Firm*—William Stock; Anne Vachon Dougherty

(57) ABSTRACT

A memory cell (10) includes a resistive structure (1), and at least two electrodes (2) coupled to the resistive structure (1), wherein: the resistive structure (1) includes hydrogen, and the resistive structure (1) includes a material that exhibits a hydrogen ion mobility value of at least $10^{-8}$ cm$^2$/Vs.

10 Claims, 2 Drawing Sheets

PROGRAMMABLE-RESISTANCE MEMORY CELL

FIELD OF THE INVENTION

The present invention relates to a programmable resistance memory cell, a method of fabrication therefor and a non-volatile memory device incorporating such a memory cell.

BACKGROUND OF THE INVENTION

For memory devices and for numerous other applications, bi-stable devices or circuits are used. For example, for storing one bit of information in a memory, a bi-stable device can be used which is switchable between at least two different and persistent states. When writing a logical "1" into the device, it is driven into one of the two persistent states and when writing a logical "0", or erasing the logical "1", the device is driven into the other of the two different states. Each of the states persists until a next step of writing information into the device or erasing information in the device proceeds.

Flash erasable programmable read only memory (FEPROM, also referred to as flash memory) is used in semiconductor devices and provides for rapid block erase operations. Typically, flash memory only uses one transistor per memory cell versus the two transistors per memory cell for known electrically erasable programmable read only memory (EEPROM). Thus, flash memory takes up less space on a semiconductor device and is less expensive to produce than EEPROM. Nevertheless, the development of further space-saving components of semiconductor devices and cost-efficient fabrication techniques for producing such devices continues.

To that end, the use of materials with bi-stable electrical resistance for semiconductor device applications has been studied. The resistance states of the material can be changed reversibly by applying appropriate electrical signals to the material. These electrical signals should be larger than a given threshold $V_T$ and longer than a given time t. The resistance state of the material can be read or analysed by applying other signals which are non-destructive to the conductivity state if they are much smaller than $V_T$.

Transition-metal oxides are one class of materials that can be conditioned such that they exhibit the desired bi-stable electrical resistance. Non-volatile two-terminal memory devices based on transition-metal oxides have been disclosed. Such devices comprise at least one memory cell, which comprises the arrangement of at least two electrodes being provided in contact with a transition-metal oxide layer. Depending on the polarity of electrical pulses applied to one of the electrodes relative to the other electrode, the electrical resistance of the transition-metal oxide switches reversibly between at least two different and persistent states. An example of such a device is given in U.S. Pat. No. 6,815,744.

The conditioning process that the transition-metal oxides are subjected to in order that the switching between the resistance states may be done comprises subjecting the transition-metal oxide to an appropriate electrical signal for a sufficient period of time, this being done via electrical signals applied to the electrodes contacting the transition-metal oxide layer as discussed above. The conditioning process generates a confined conductive region in the transition-metal oxide that can be reversibly switched between two or more resistance states.

Some of the drawbacks of the above-described devices are associated with the conditioning process. This is because, not only is the conditioning process time-consuming, it is required per cell incorporated in such a device. Furthermore, the confined conductive region that is generated by the conditioning process occurs at an arbitrary position in the dielectric material, i.e., the position of the conducting path is not controllable by well-defined process parameters. This may cause a large variation in the electrical properties of such devices, that are otherwise nominally identical, to be observed. Some of the drawbacks are attributed to the rather long response time for switching the resistance states of such devices, which may typically range between 100 ns to 10 μs.

Accordingly, it is desirable to provide a programmable resistance memory cell that mitigates and/or obviates the drawbacks associated to known programmable resistance memory cells.

SUMMARY OF THE INVENTION

According to an embodiment of a first aspect of the present invention, there is provided a memory cell comprising: a resistive structure, and at least two electrodes coupled to the resistive structure, wherein: the resistive structure comprises hydrogen, and the resistive structure comprises a material that exhibits a hydrogen ion mobility value of at least $10^{-8}$ cm$^2$/Vs. In order to initiate a conditioning process so that a confined conductive region is formed in the resistive structure, an electrical signal, such as, for example, an electrical pulse, is applied to one of the at least two electrodes relative to the other of the two electrodes. Since the resistive structure comprises hydrogen, by virtue of comprising a material having a structural composition including hydrogen, i.e. it inherently contains hydrogen, and/or being treated with a gas comprising hydrogen during/after being deposited, in which case the material of the resistive structure need not inherently contain hydrogen from the outset, the aforementioned electrical signal that is applied to the electrodes also causes ionization of the hydrogen in the resistive structure. The mobility of the hydrogen ions contributes to the conditioning process being accelerated and the electrochemical reactions associated with the conditioning process being of reduced duration compared to previously-proposed devices. Not only is the time taken for the conditioning process reduced, but also some of the non-uniformities associated therewith are reduced. Thus, memory cells having a lower statistical spread of operating characteristics and being of increased reliability than previously-proposed memory cells may be produced. Furthermore, in an embodiment of the present invention, the hydrogen ion mobility also leads to reduced response times of the resistance switching when an electrical signal is applied to the electrodes to cause such switching compared to previously-proposed devices.

Preferably, at least one of the electrodes is substantially impermeable to hydrogen. Since the hydrogen ion concentration at the electrode interface facilitates the solid state electrochemistry, hereinafter referred to as electrochemical reactions, associated with the resistance switching, it is preferable that at least one of the electrodes in an embodiment of the present invention is substantially impermeable to hydrogen. In this way, the hydrogen ions accumulate at the electrode interface instead of migrating into the electrode. This may contribute to the electrochemical reactions associated with the resistance switching being of reduced duration compared to in previously-proposed devices.

Desirably, at least one of the electrodes is substantially chemically inert to hydrogen. An advantage associated with this feature is that the hydrogen ions accumulate at the electrode interface, so contributing to the electrochemical reactions associated with the resistance switching, rather than reacting with the electrodes. The latter feature is also undesirable in that it may cause corrosion of the electrodes.

Preferably, at least one of the electrodes comprises one of: platinum (Pt), iridium (Ir), rhodium (Rd), ruthenium (Ru), rhenium (Re), osmium (Os) and an alloy comprising at least one of such elements. Electrodes made of such materials facilitate the accumulation of hydrogen ions at the electrode interface and/or also have a reduced tendency to form hydrides or hydroxides.

Desirably, the resistive structure comprises a material comprising one of: a dielectric material, a semiconductor and a metal. In this context, the chosen material is one that supports electrochemical reactions in which hydrogen ion mobility plays a role, i.e. by contributing to such electrochemical reactions being of reduced duration. Furthermore, in the context of the present invention, the chosen material exhibits the property of having a hydrogen ion mobility value of at least $10^{-8}$ cm$^2$/Vs.

Preferably, the resistive structure comprises a hydrogen-doped material. This feature provides the advantage that, since the hydrogen is present in the material by virtue of weaker binding forces, for example, by non-covalent binding and/or non-stoichiometric inclusion, it is able to better support the electrochemical reactions associated with the resistance switching than if it were inherently part of the structural composition of the material. In the latter case, the mobility of the hydrogen would be dependent on whether or not a site-vacancy were created for occupancy by the hydrogen.

Desirably, the resistive structure comprises a transition-metal oxide. The ionic mobility of hydrogen when the resistive structure comprises a transition-metal oxide provides for accelerating the conditioning process and/or the switching of the resistance state of the resistive structure.

Preferably, the resistive structure comprises a polymer with hydrogen-conducting capability. Advantages associated with this feature are: ease of fabrication, the flexibility of polymers and being back-end of the line compatible.

According to an embodiment of a second aspect of the present invention, there is provided a non-volatile memory device comprising at least one memory cell according to an embodiment of the first aspect of the present invention. The advantageous features and/or properties of a memory cell as above-described are also displayed by a non-volatile memory device incorporating such a memory cell.

Corresponding method aspects are also provided and so according to an embodiment of a third aspect of the present invention, there is provided a method for fabricating a memory cell comprising the steps of: providing a resistive structure comprising hydrogen and comprising a material exhibiting a hydrogen ion mobility value of at least $10^{-8}$ cm$^2$/Vs, and coupling at least two electrodes to the resistive structure.

Any of the device features may be applied to the method aspect of the invention and vice versa. Features of one aspect of the invention may be applied to another aspect of the invention. Any disclosed embodiment may be combined with one or several of the other embodiments shown and/or described. This is also possible for one or more features of the embodiments.

BRIEF DESCRIPTION OF THE DRAWINGS

Reference will now be made, by way of example, to the accompanying drawings, in which.

DETAILED DESCRIPTION OF PREFERRED EMBODIMENTS

Figure 1:
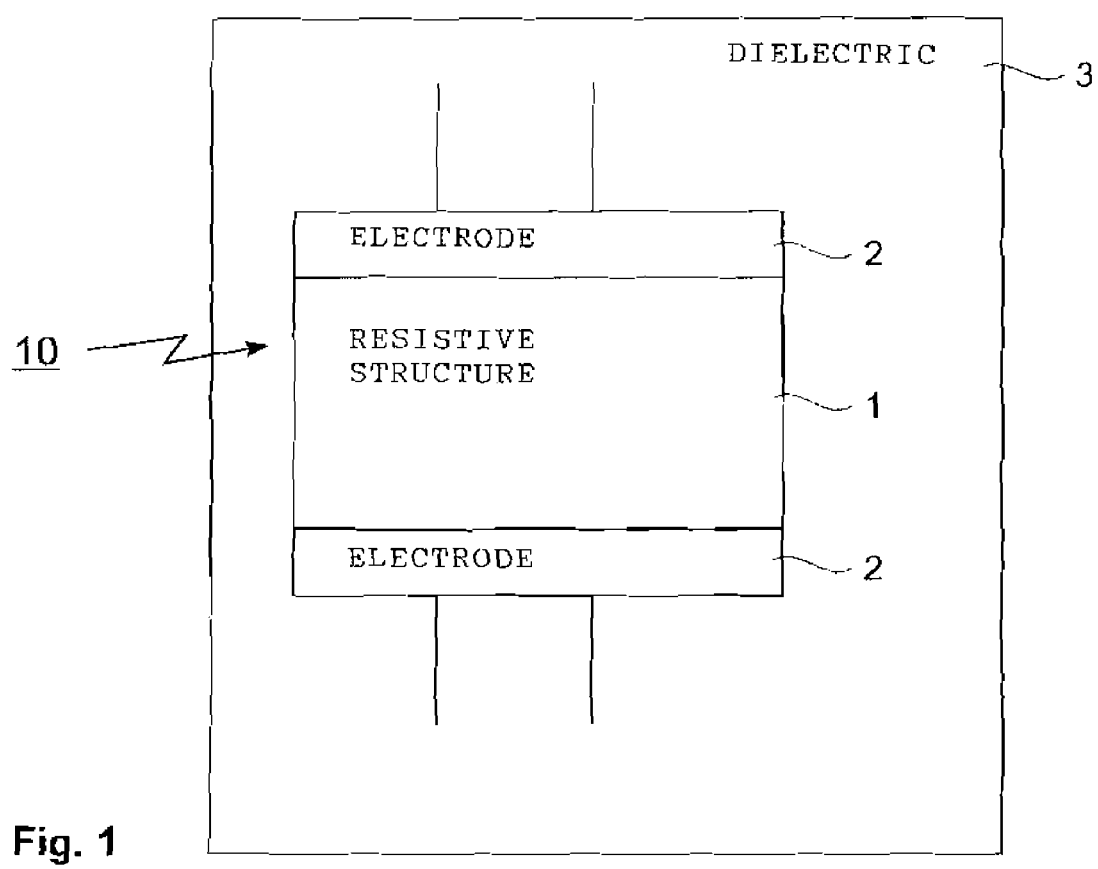
FIG. 1 schematically illustrates an embodiment of the first aspect of the present invention, and FIG. 2 schematically illustrates an embodiment of the third aspect of the present invention.

Within the description, the same reference numerals or signs have been used to denote the same parts or the like.

FIG. 1 schematically illustrates a memory cell 10 according to an embodiment of the present invention. As can be seen from FIG. 1, there is provided a resistive structure 1 to which at least two electrodes 2 are coupled. In the present case, electrodes 2 are shown to be coupled to the resistive structure 1 by direct contact but it could be that at least a coupling layer, such as, for example, an adhesion layer to aid electrical contact between the electrodes 2 and the resistive structure 1, is provided between the electrodes 2 and the resistive structure 1. The material of the resistive structure 1 is chosen so as to exhibit a hydrogen ion mobility value of at least $10^{-8}$ cm$^2$/Vs. The resistive structure 1 comprises hydrogen by virtue of comprising a material having a structural composition including hydrogen and/or being treated with a gas comprising hydrogen during/after being deposited, for example in an annealing treatment. A dielectric material 3, such as, for example, silicon dioxide (SiO$_2$) is formed around the memory cell 10.

Reference is henceforth made to the material of the resistive structure 1 being a hydrogen-doped transition-metal oxide layer, specifically a transition-metal oxide layer comprising interstitial hydrogen. In this regard, examples of suitable transition-metal oxides have been provided hereinbelow. The present invention is, of course, not limited thereto and other materials, which have been described hereinbelow, may also be used for the resistive structure 1.

In order to initiate a conditioning process so that a confined conductive region is formed in the resistive structure 1, an electrical signal, such as, for example, an electrical pulse, is applied to one of the at least two electrodes 2 relative to the other of the two electrodes 2. This causes the ionization of the hydrogen in the transition-metal oxide layer. The mobility of the hydrogen ions contributes to the conditioning process being accelerated and the electrochemical reactions associated with the conditioning process being of reduced duration compared to previously-proposed devices.

When resistance switching of the resistive structure 1 is initiated by the application of an electrical signal to one of the at least two electrodes 2 relative to the other of the two electrodes 2, the spatial distribution of hydrogen ions in the transition-metal oxide is altered. Specifically, hydrogen ions are repelled from the electrode 2 to which a positive electrical signal has been applied and will migrate towards the interface of the other of the two electrodes 2, where they facilitate the electrochemical reactions associated to the switching process. In this regard, the hydrogen ion mobility in the transition-metal oxide contributes to such electrochemical reactions being of reduced duration and so the response times of an embodiment of the present invention being lower than previously-proposed devices.

Since the hydrogen ion concentration at the electrode interface facilitates the electrochemical reactions associated with the resistance switching, the electrodes 2 in an embodiment of the present invention comprise a material that is substantially impermeable to hydrogen. In this way, the hydrogen ions accumulate at the electrode interface instead of migrating into the electrodes 2. Furthermore, the material of the electrodes is selected on account of being chemically inert to hydrogen. In this way, the hydrogen ions that accumulate at the electrode interface contribute to the electrochemical reactions associated with the resistance switching, rather than reacting with the electrodes 2. For the material of the electrodes 2, one of: platinum (Pt), iridium (Ir), rhodium (Rd), ruthenium (Ru), rhenium (Re), osmium (Os) and an alloy comprising at least one of such elements, is chosen. An embodiment of the present invention is, of course, not limited to the use of such materials for the electrodes and indeed any material that is substantially impermeable and/or chemically inert to hydrogen may be used.

In an embodiment of the present invention, the material of the resistive structure 1 is chosen on account of having a hydrogen ion mobility value of at least $10^{-8}$ cm$^2$/Vs. In this regard, a diverse range of materials may be selected for the resistive structure 1. For example, the material of the resistive structure 1 may be chosen from the group of: a dielectric material, a semiconductor and a metal. In this context, the chosen material is one that supports electrochemical reactions in which hydrogen ion mobility plays a role, i.e. by contributing to such electrochemical reactions being of reduced duration. The resistive structure 1 can be made of a hydrogen-doped material, i.e. by the non-covalent binding and/or non-stoichiometric inclusion of hydrogen in the material.

Examples of the transition-metal oxide that can be selected for the resistive structure 1 on account of exhibiting hydrogen mobility values of substantially greater than $10^{-8}$ cm$^2$/Vs are, for example, acceptor-doped strontium titanate (SrTiO$_3$), strontinum zirconate (SrZrO$_3$), barium titanate (BaTiO$_3$) and barium zirconate (BaZrO$_3$). As regards barium zirconate, Ba(Zr$_{1-x}$M$_x$)O$_{3-\delta}$ with M=indium (In), scandium (Sc), yttrium (Y) or gallium (Ga), x=0 to 0.5, δ=0 to 0.5 may be selected. Yttrium (Y) or neodymium (Nd) doped calcium zirconate (CaZrO$_3$) may also be selected, for example. Rare-earth doped cerates such as: barium cerate, Ba(Ce$_{1-x}$M$_x$)O$_{3-\delta}$ with M=yttrium (Y), ytterbium (Yb), neodymium (Nd), samarium (Sm), x=0 to 0.8, δ=0 to 0.5, or strontium cerate, Sr(Ce$_{1-x}$Yb$_x$)O$_{3-\delta}$, where Yb=ytterbium, x=0 to 0.8, δ=0 to 0.5, may be selected, for example. A further example for the material of the resistive structure 1 is lithium oxide (Li$_2$O).

Alternatively, for the material of the resistive structure 1, a polymer with hydrogen-conducting capability may be selected. In this regard and for the sake of example, the polymer may comprise one of: Naphion™ and poly-ethylene-oxide (PEO).

The present invention also extends to a non-volatile memory device comprising at least one memory cell 10 according to an embodiment of the present invention and as described above.

Figure 2:
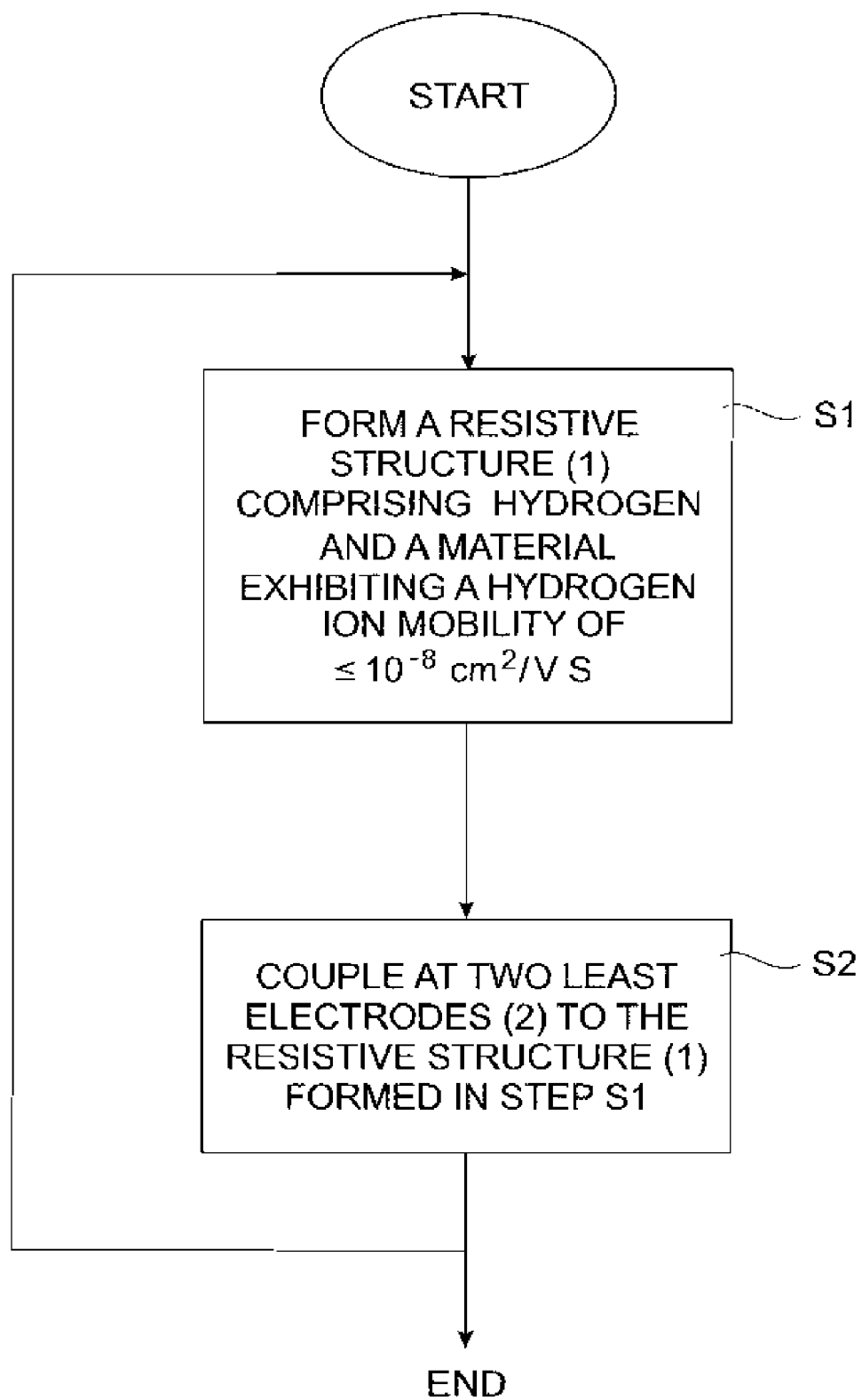

Reference is now made to FIG. 2, which schematically illustrates a method according to an embodiment of the present invention. A method according to an embodiment of the present invention is started by, in a step S1, forming a resistive structure 1 comprising hydrogen and a material exhibiting a hydrogen ion mobility value of at least $10^{-8}$ cm$^2$/Vs (S1). The method is completed after a step S2, where at least two electrodes 2 are formed so as to be coupled to the resistive structure 1. A method according to an embodiment of the present invention is not limited to being performed once, i.e. after the completion of step S2, the process may loop back to the start of the method and steps S1 to S2 may be performed iteratively, thereby to produce multiple layers of memory cells according to an embodiment of the present invention. Any of the steps S1 or S2 can be performed in parallel or without maintaining a strict order of sequence. Any suitable technique known to a skilled person can be used for any of these steps. The method described with reference to FIG. 2 can be supplemented with further steps corresponding to features in a memory cell according to an embodiment of the present invention as described above.

Whilst an embodiment of the present invention has been described with reference to a stacked arrangement of the resistive structure 1 and the at least two electrodes, 2, the present invention is not limited thereto and any suitable arrangement is taken to fall within the scope of the present invention, for example, where the resistive structure 1 and the electrodes 2 are arranged parallel to the x-plane.

An embodiment of the present invention is advantageously applicable to materials with more than two persistent resistance states.

The present invention has been described above purely by way of example and modifications of detail can be made within the scope of the invention.

Each feature disclosed in the description, and, where appropriate, the claims and the drawings may be provided independently or in any appropriate combination.

The invention claimed is:

1. A memory cell comprising:
   a resistive structure, and
   at least two electrodes coupled to the resistive structure, wherein:
   the resistive structure comprises hydrogen, and
   the resistive structure comprises a material that exhibits a hydrogen ion mobility value of at least $10^{-8}$cm$^2$/Vs.

2. A memory cell as claimed in claim 1, wherein at least one of the electrodes is substantially impermeable to hydrogen.

3. A memory cell as claimed in claim 1, wherein at least one of the electrodes is substantially chemically inert to hydrogen.

4. A memory cell as claimed in claim 1, wherein at least one of the electrodes comprises one of:
   platinum (Pt), iridium (Ir), rhodium (Rd), ruthenium (Ru), rhenium (Re), osmium (Os) and an alloy comprising at least one of such elements.

5. A memory cell as claimed in claim 1, wherein the resistive structure comprises a material comprising one of: a dielectric material, a semiconductor and a metal.

6. A memory cell as claimed in claim 1, wherein the resistive structure comprises a hydrogen-doped material.

7. A memory cell as claimed in claim 1, wherein the resistive structure comprises a transition-metal oxide.

8. A memory cell as claimed in claim 1 wherein the resistive structure comprises a polymer.

9. A non-volatile memory device comprising at least one memory cell comprising:
   a resistive structure, and
   at least two electrodes coupled to the resistive structure, wherein:
   the resistive structure comprises hydrogen, and the resistive structure comprises a material that exhibits a hydrogen ion mobility value of at least $10^{-8}$cm$^2$/Vs.

10. A method for fabricating a memory cell comprising the steps of:
    providing a resistive structure comprising hydrogen and comprising a material exhibiting a hydrogen ion mobility value of at least $10^{-8}$cm$^2$/Vs, and
    coupling at least two electrodes to the resistive structure.

* * * * *